US008487644B2

(12) United States Patent
Huang et al.

(10) Patent No.: US 8,487,644 B2
(45) Date of Patent: Jul. 16, 2013

(54) METHOD AND PATTERN CARRIER FOR OPTIMIZING INSPECTION RECIPE OF DEFECT INSPECTION TOOL

(75) Inventors: Pong-Wey Huang, Tainan (TW);
Hsi-Hua Liu, Taipei (TW); Chia-Jen Wang, Pingtung County (TW);
Shuen-Cheng Lei, Taipei County (TW);
Huai-Te Huang, Kaohsiung County (TW); Jen-Po Huang, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 336 days.

(21) Appl. No.: 12/840,503

(22) Filed: Jul. 21, 2010

(65) Prior Publication Data

US 2012/0019279 A1    Jan. 26, 2012

(51) Int. Cl.
*G01R 31/26* (2006.01)
(52) U.S. Cl.
USPC .................................................. 324/762.01
(58) Field of Classification Search
USPC ............. 324/762.01–762.1, 755.01–755.1, 324/754.01–754.3; 257/48; 438/14–18
See application file for complete search history.

(56) References Cited

U.S. PATENT DOCUMENTS

| | | | |
|---|---|---|---|
| 5,383,018 A | 1/1995 | Sadjadi | 356/243 |
| 5,917,332 A | 6/1999 | Chen et al. | 324/765 |
| 6,246,472 B1 | 6/2001 | Yoda et al. | 356/237.2 |
| 6,411,378 B1 | 6/2002 | Pike | 356/237.5 |
| 6,496,596 B1 | 12/2002 | Zika et al. | 382/149 |
| 6,589,860 B1 | 7/2003 | Ang et al. | 438/613 |
| 6,835,579 B2 * | 12/2004 | Elward | 438/15 |
| 7,027,146 B1 | 4/2006 | Smith et al. | 356/246.6 |
| 7,339,391 B2 | 3/2008 | Lin | 324/765 |
| 7,356,787 B2 | 4/2008 | Yan et al. | 716/4 |
| 7,915,718 B2 * | 3/2011 | Lee et al. | 257/668 |
| 2007/0035726 A1 | 2/2007 | Takahashi et al. | 356/237.1 |

OTHER PUBLICATIONS

Amy Engbrecht et al., "An Approach for Improving Yield with Intentional Defects" Advanced Semiconductor Manufacturing 2002 IEEE/SEMI Conference and Workshop, 2002, pp. 284-288.
Abbie L. Warrick et al., "Application of Intentional Defect Arrays for Assessing Wafer Inspection Tool Capabilities" Metrology, Inspection, and Process Control for Microlithography XVI, Daniel J. C. Herr, Editors, pp. 549-557.

* cited by examiner

*Primary Examiner* — Tung X Nguyen
(74) *Attorney, Agent, or Firm* — Ding Yu Tan

(57) ABSTRACT

A method for optimizing an inspection recipe of a defect inspection tool is described. A substrate having thereon intentional defects and locating patterns beside the intentional defects is provided. The defect inspection tool is used to detect the intentional defects with an inspection recipe and obtain the distribution of undetected or partially detected intentional defects. The locating patterns are utilized to locate the undetected or partially detected intentional defects and thereby determine the type(s) of the undetected or partially detected intentional defects. The inspection recipe is modified according to the type(s) of the undetected or partially detected intentional defects in a manner such that there is a minimal number of undetected or partially detected intentional defects under the inspection of the defect inspection tool.

11 Claims, 5 Drawing Sheets

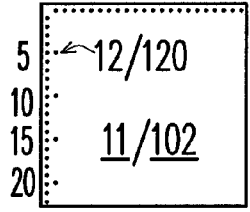 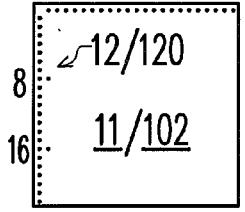 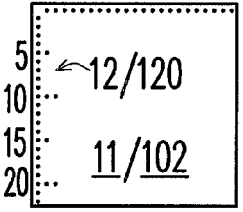 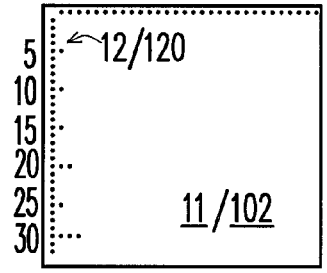
FIG. 2A  FIG. 2B  FIG. 2C  FIG. 2D
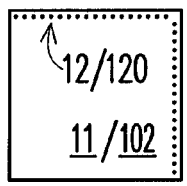 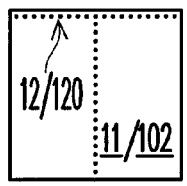 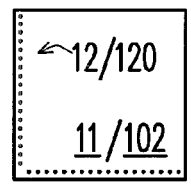 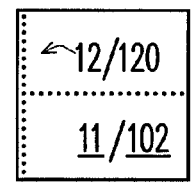
FIG. 2E  FIG. 2F  FIG. 2G  FIG. 2H
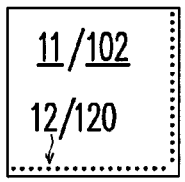 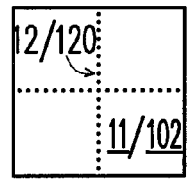 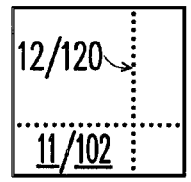
FIG. 2I  FIG. 2J  FIG. 2K
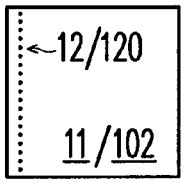 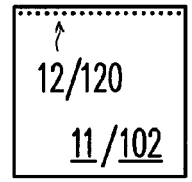 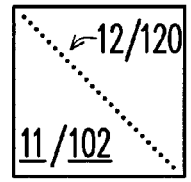 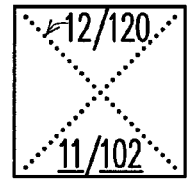
FIG. 2L  FIG. 2M  FIG. 2N  FIG. 2O

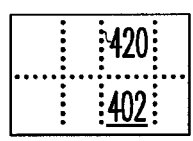 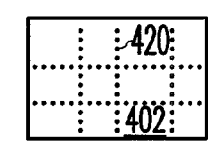 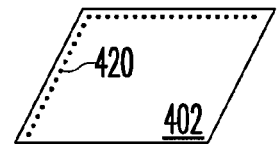
FIG. 4E  FIG. 4F  FIG. 4G
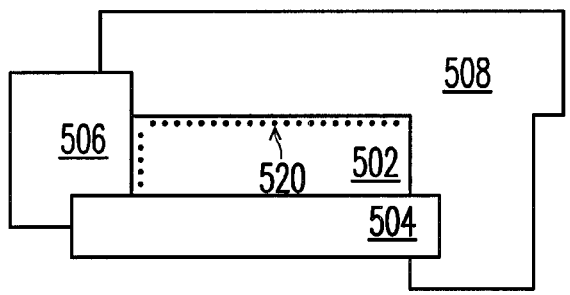
FIG. 5
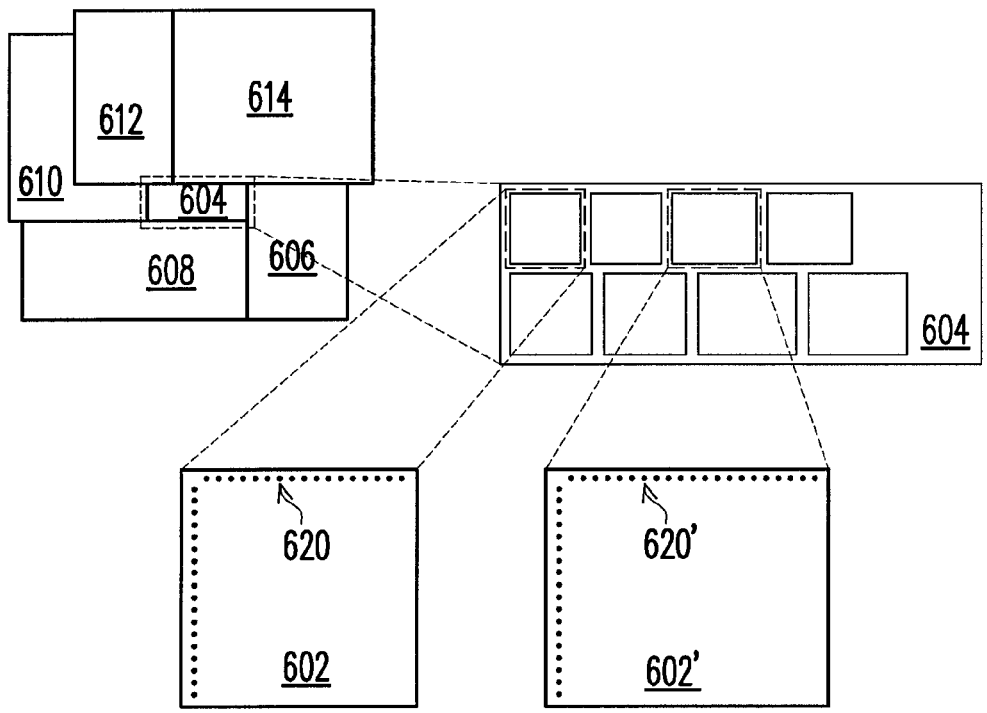
FIG. 6

METHOD AND PATTERN CARRIER FOR OPTIMIZING INSPECTION RECIPE OF DEFECT INSPECTION TOOL

BACKGROUND OF THE INVENTION

1. Field of Invention

This invention relates to defect inspection in semiconductor processes, and more particularly to a method for optimizing the inspection recipe of a defect inspection tool, and a pattern carrier (semiconductor substrate or photomask) for optimizing the same.

2. Description of Related Art

In an IC process, each wafer must be frequently inspected for defects in different layers. A defect inspection tool used in an IC process may utilize reflection of UV light, deep UV light or electron beam to detect defects, wherein the inspection recipe has to be optimized previously so that different types of defects in a layer can be well detected. The optimization may include inspecting a wafer with some defects of the target layer thereon by the defect inspection tool, and modifying the inspection recipe until there is a minimal number of undetected or partially detected defects under the inspection of the defect inspection tool. When the sensitivity of the inspection tool reaches to its limit, some of the defects cannot be found or fully detected.

A wafer with defects of the target layer thereon can be formed using a dedicated photomask with patterns of intentional defects. This approach costs a lot as requiring a dedicated photomask. Moreover, extra recipe and inspection time are also needed for the extra dedicated photomask. Since the intentional defects cannot accurately reflect the real defects of the product design, the inspection results are not accurate enough and more time is required to modify the inspection recipes.

Another method is to use some wafers with random defects from the production line for the test inspection of the defect inspection tool. However, when the wafers are damaged or not good enough for this purpose, the engineers have to pay efforts to find alternative wafers. Also, the engineers have to take hours to check for the defects by SEM review tools to confirm whether the defects of interest exist or not.

Another method is to modify the inspection recipe by trial and error. However, in-line recipe modification requires experienced operators and takes long time.

FIG. 8 illustrates an exemplary distribution of undetected or partially detected intentional defects in a test area (802) in the prior art. Among the intentional defects 840, the detected ones are each represented by the symbol "x" and the undetected or partially detected ones are each represented by a blank space. The intentional defects in the region 802-1 are found difficult to detect, and those in the region 802-2 are found marginal to the detection, wherein the intentional defects in the region 802-1 can be called nuisance defects. Since the defect inspection tool cannot identify the shapes of the various intentional defects 840, it is difficult to identify the types of the undetected or partially detected intentional defects in the regions 802-1 and 802-2.

SUMMARY OF THE INVENTION

In view of the foregoing, this invention provides a method for optimizing the inspection recipe of a defect inspection tool.

This invention also provides a pattern carrier for optimizing the inspection recipe of a defect inspection tool.

The method of this invention is described below. A substrate having thereon a plurality of intentional defects and a plurality of locating patterns beside the intentional defects is provided. The defect inspection tool is used to detect the intentional defects with an inspection recipe and obtain the distribution of undetected or partially detected intentional defects. The locating patterns are used to locate the undetected or partially detected intentional defects and thereby determine the type(s) thereof. The inspection recipe is modified according to the type(s) of the undetected or partially detected intentional defects in a manner such that there is a minimal number of undetected or partially detected intentional defects under the inspection of the defect inspection tool.

The pattern carrier of this invention has thereon a plurality of intentional defects and a plurality of locating patterns beside the intentional defects, and is a semiconductor substrate or a photomask.

In some embodiments, the locating patterns and intentional defects are formed in a test area surrounded by a plurality of product areas. As the pattern carrier include areas of different products, the intentional defects are designed for one of the products and may be formed in only a part of a test area surrounded by the areas of the products along with the locating patterns. For the intentional defects are formed simultaneously with the defects in the product areas, the intentional defects can accurately reflect the real defects of the product devices so that the inspection results are accurate enough.

In some embodiments, the locating patterns include at least one string of locating patterns arranged linearly. As the intentional defects are disposed in rows and columns, the at least one string of locating patterns may include: at least one column of row-locating patterns, at least one row of column-locating patterns, or at least one column of row-locating patterns and at least one row of column-locating patterns. Or, the at least one string of locating patterns are arranged diagonally in a rectangular area.

Because the locating patterns allow rapid location of the undetected or partially detected intentional defects in this invention, the type(s) of the undetected or partially detected intentional defects can be rapidly determined according to the predetermined distributions of different types of intentional defects. Thus, the modification of the inspection recipe can be started earlier.

In order to make the aforementioned and other objects, features and advantages of the present invention comprehensible, a preferred embodiment accompanied with figures is described in detail below.

BRIEF DESCRIPTION OF THE DRAWINGS

FIGS. 2A-2O illustrate the distributions of locating patterns according to some other embodiments of this invention.

FIGS. 3A-3C and FIGS. 4A-4G illustrate the distributions of locating patterns according to two more groups of embodiments of this invention.

FIGS. 5-6 illustrate two examples of a test area formed with locating patterns and intentional defects but no product device therein according to two embodiments of this invention.

DESCRIPTION OF EMBODIMENTS

Figure 1A:
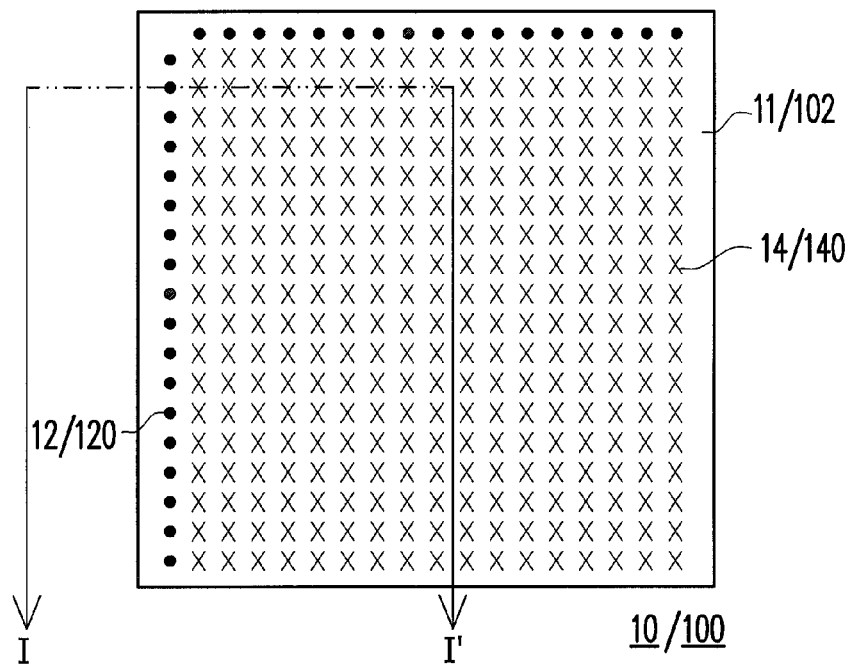
FIG. 1A illustrates, in a top view, the distribution of locating patterns in a test area with intentional defects therein according to an embodiment of this invention.
Figure 1B:
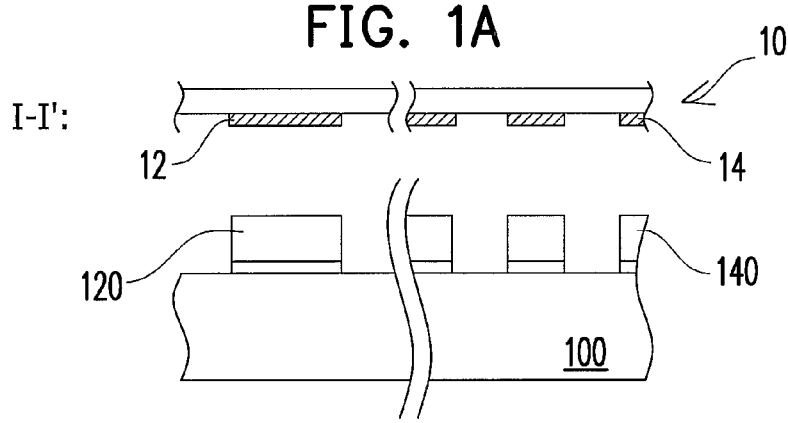
FIGS. 1B-1C illustrate two forms of the locating patterns in the I-I' cross-sectional view.
Figure 1C:
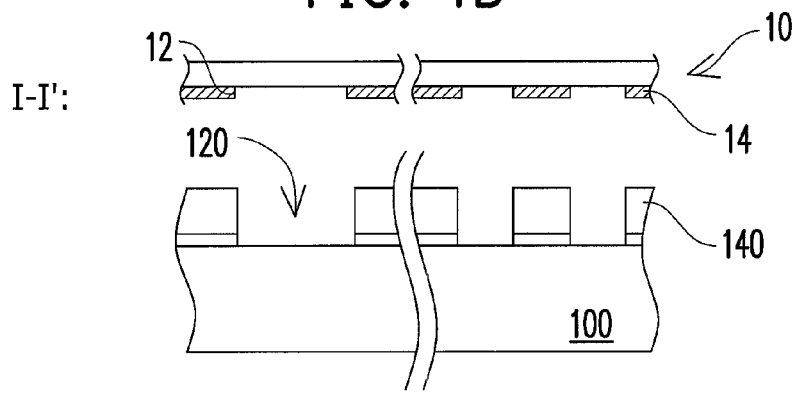

FIG. 1A illustrates, in a top view, the distribution of locating patterns in a test area with intentional defects therein according to an embodiment of this invention, and FIGS. 1B-1C illustrate two forms of the locating patterns in the I-I' cross-sectional view. Since the locating patterns and the intentional defects on a substrate have substantially the same shapes as the corresponding patterns on a photomask from which the patterns on the substrate can be transferred, the substrate patterns and the photomask patterns are shown in the same figure. This also applies to the cases of FIGS. 2A-2N & 3-6.

Referring to FIG. 1A, a plurality of locating patterns 12/120 and a plurality of intentional defects 14/140 are disposed in an approximately square area 11/102 on a photomask/substrate 10/100. The locating patterns 12/120 are beside the intentional defects 14/140, including a column of row-locating patterns arranged linearly at the left edge of the area 11/102 and a row of column-locating patterns arranged linearly at the front edge of the test area 11/102. The intentional defects 14/140 are usually formed in a 2D array corresponding to the row-locating patterns and the column-locating patterns as illustrated, so that the undetected intentional defects 140 on the substrate 100 can be easily identified and counted. The intentional defects 14/140 may alternatively be formed at only a part of the intersections of the rows and the columns, if only the predetermined distribution thereof is available for comparison with the distribution of the really detected intentional defects in the subsequent defect inspection test of the defect inspection tool.

Each locating pattern 12/120 may be larger than each intentional defect 14/140 in size as shown in the figure, so that the locating patterns 120 on the substrate 100 can be easily identified and counted in the step of locating the undetected intentional defects 140. Nevertheless, each locating pattern 12/120 may alternatively be similar to each intentional defect 14/140 in size, or in size and shape, if only clear identification and rapid counting of the locating patterns 120 are possible.

Moreover, the locating patterns 120 on the substrate 100 may have the same spatial form as the intentional defects 140, i.e., the locating patterns 120 and intentional defects 140 may each comprise a substance as shown in FIG. 1B, or may all be openings. The locating patterns 120 may alternatively have a spatial form complementary to that of the intentional defects 140, that is, the locating patterns 120 are openings and the intentional defects 140 comprise a substance as shown in FIG. 1C, or the locating patterns 120 comprise a substance and the intentional defects 140 are openings. For example, when the intentional defects 140 correspond to real defects of the patterns of a SiN hard mask for defining active areas of a product, the locating patterns 120 may also comprise SiN in the case of FIG. 1B, or may be openings in the SiN layer in the case of FIG. 1C. Cross-sectional views of the corresponding photomasks 10 with the locating patterns 12 and the intentional defects 14 are also illustrated in FIGS. 1B & 1C, wherein the intentional defects 14 may comprise an opaque or semi-transparent material, and the locating patterns 12 may comprise the same material or be openings in the material.

In addition, the row-locating patterns and column-locating patterns 12/120 each have the same shape in the above embodiment. In other embodiments, in at least one of the column of row-locating patterns and the row of column-locating patterns, it is possible that a group of locating patterns with an interval of at least one locating pattern each have a shape different from that of each of the other locating patterns, so that it is not necessary to count the locating patterns one by one from the first locating pattern in locating the undetected intentional defects and more time is saved. For example, it is possible that the (n×i)-th locating patterns (n≧2, i=1, 2, 3 . . . ) in the arrangement direction of the string of locating patterns arranged linearly have more segments than each of the other locating patterns, as illustrated in FIGS. 2A-2D.

In the embodiment illustrated by FIG. 2A or 2B, m is equal to 5 or 8, and the (5×i)-th or (8×i)-th locating patterns in the column of row-locating patterns 12/120, i.e., the $5^{th}$, $10^{th}$ locating patterns or the $8^{th}$, $16^{th}$ . . . locating patterns, each have the same number of segments (e.g., two segments) while the other locating patterns in the column of row-locating patterns 12/120 each may have only one segment as illustrated.

In the embodiment illustrated by FIG. 2C, it is also the column of row-locating patterns 12/120 that is modified and n is also equal to 5, while among the [n×i]-th ($5^{th}$, $10^{th}$, $15^{th}$, $20^{th}$ . . . ) locating patterns, the [n×(2i−1)]-th ($5^{th}$, $15^{th}$ . . . ) locating patterns each have the same number of segments (e.g., two segments), and the (n×2i)-th ($10^{th}$, $20^{th}$ . . . ) locating patterns each have more segments (e.g., three segments) than the [n×(2i−1)]-th ($5^{th}$, $15^{th}$ . . . ) locating patterns.

The embodiment illustrated by FIG. 2D is different from that illustrated by FIG. 2C in that in the (n×2i)-th ($10^{th}$, $20^{th}$ . . . ) locating patterns 12/120, the number of segments of locating pattern 12/120 increases with the increase in the value of i. It is possible that the $10^{th}$ locating pattern in the column of row-locating patterns 12/120 has 2 segments, the $20^{th}$ locating pattern has 3 segments and the $30^{th}$ locating pattern has 4 segments, as shown in FIG. 2D. With such a design, much less locating patterns has to be counted in locating the undetected intentional defects and much more time is saved.

Moreover, though the column of row-locating patterns 12/120 is disposed at the left edge of the approximately square area 11/102, it may alternatively be disposed at the right edge or at the middle of the same, as shown in FIGS. 2E and 2F. Similarly, though the row of column-locating patterns 12/120 is disposed at the front edge of the area 11/102, it may alternatively be disposed at the rear edge or at the middle of the same, as shown in FIGS. 2G and 2H.

It is also possible that the column of row-locating patterns 12/120 is disposed at the right edge of the area 11/102 and the row of column-locating patterns 12/120 is disposed at the rear edge of the same, as illustrated in FIG. 2I. In the embodiment illustrated by FIG. 2J (or 2K), the column of row-locating patterns 12/120 and the row of column-locating patterns 12/120 are both disposed at the middle (or around the middle) of the area 11/102.

Moreover, it is also possible that there are more than one row of column-locating patterns and/or more than one column of row-locating patterns at different part of the test region, so that the undetected intentional defects can be located more easily.

Further, a row of column-locating patterns or a column of row-locating patterns may not be required in some cases and can be omitted, as shown in FIGS. 2L-2M. It is also possible to dispose one or two strings of diagonally arranged locating patterns 12/120 in the area 11/102 instead of column- and row-locating patterns, as shown in FIG. 2N or 2O.

It is also noted that for each of the columns of row-locating patterns, the rows of column-locating patterns and the string of diagonally arranged locating patterns as a string of locating patterns arranged linearly in the above embodiments shown in FIGS. 2E-2N, it is possible that a group of locating patterns with an interval of at least one locating pattern each have a shape different from that of each of the other locating patterns, as in the cases of FIGS. 2A-2D.

Figure 3A:
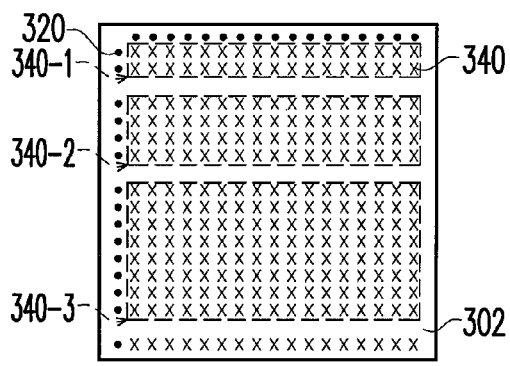
Figure 3B:
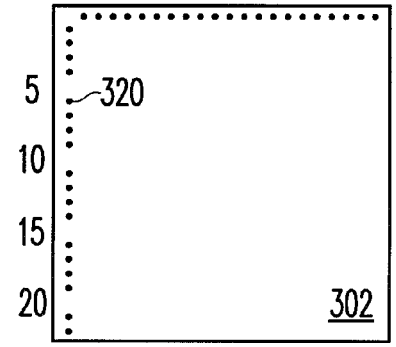
Figure 3C:
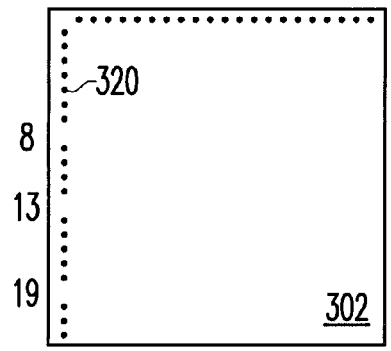
Figure 4A:
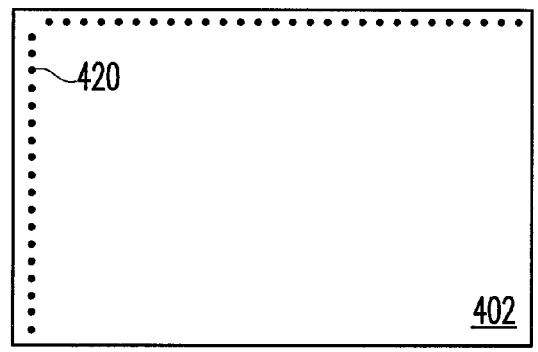
Figure 4B:
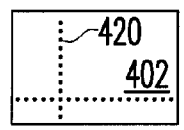
Figure 4C:
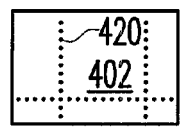
Figure 4D:
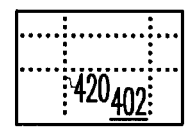

Moreover, though a string of locating patterns arranged linearly in each of the above embodiments have uniform spacing, they may alternatively have non-uniform spacing, wherein the wider spacing may serve as a separator between different types of intentional defects so that the operator can located the undetected intentional defects and determine their type(s) more easily. FIGS. 3A-3C illustrate three such embodiments. In the embodiment shown in FIG. 3A, at least three groups (340-1, 340-2 & 340-3) of intentional defects of three different types are disposed in the area 302 corresponding to the same number of groups of row-locating patterns 320 in position, and the spacing between two neighboring locating patterns 320 in two neighboring groups is larger than that of two neighboring locating patterns 320 in the same group. In the embodiment shown in FIG. 3B or 3C, wider spacings are present in a constant or varying interval.

Further, though the area 11/102 or 302 in which the intentional defects and the locating patterns are formed in each of the above embodiments has an approximately square shape, the area may alternatively have a rectangular shape or tilted parallelogram shape with unequal width and length. FIGS. 4A-4G illustrate seven such embodiments. In the embodiment shown in FIG. 4A or 4B, there are only one row of column-locating patterns 420 and only one column of row-locating patterns 420 each disposed at an edge or the middle of a rectangular area 402, wherein more column-locating patterns 420 than row-locating patterns 420 are disposed in the area 402 having a larger dimension in the row direction, and the intentional defects are omitted just for simplification.

In the embodiment shown in FIG. 4C, 4D, 4E or 4F, there are one or two rows of column-locating patterns and two or three columns of row-locating patterns disposed at the middle of the rectangular area 402. In the embodiment shown in FIG. 4G, there are only one row of column-locating patterns 420 and only one column of row-locating patterns 420 disposed at two neighboring edges of a tilted parallelogram area 402.

FIGS. 5-6 illustrate two exemplary types of the test area formed with locating patterns and intentional defects but no product device according to two embodiments of this invention. In the embodiment illustrated by FIG. 5, the test area 502 formed with row- and column-locating patterns 520 and intentional defects (not shown) for a certain product is surrounded by a plurality of product areas 504, 506 and 508.

In the embodiment illustrated by FIG. 6, the test area 604 is surrounded by a plurality of areas 606, 608, 610, 612 and 614 of different products, and is divided into a plurality of areas for forming intentional defects of the different products. The areas may include two neighboring areas 602 for forming the intentional defects (not shown) of a first product along with corresponding locating patterns 620, and two neighboring wider rectangular areas 602' for forming the intentional defects (not shown) of a second product along with the corresponding locating patterns 620', where the second product is different from the first product only in having a larger pitch. Such a first product and a second product may be SRAM products.

In the above embodiments illustrated by FIGS. 5-6, since the intentional defects are formed simultaneously with the defects in the product areas, the intentional defects can accurately reflect the real defects of the product devices so that the inspection results are accurate enough.

Figure 7:
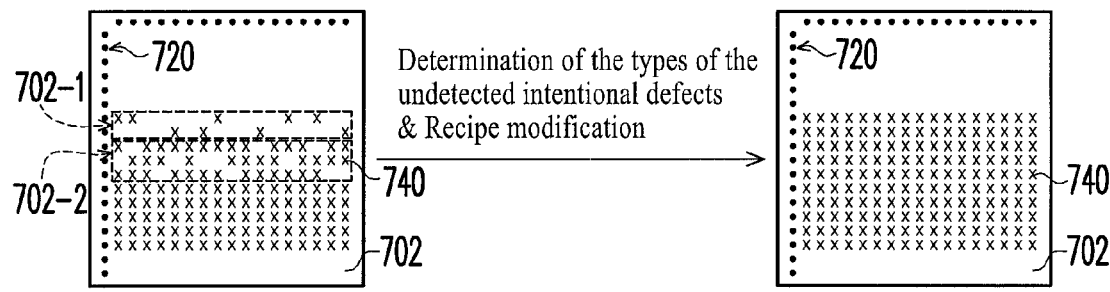
FIG. 7 illustrates a method for optimizing the inspection recipe of a defect inspection tool according to an embodiment of this invention.
Figure 8:
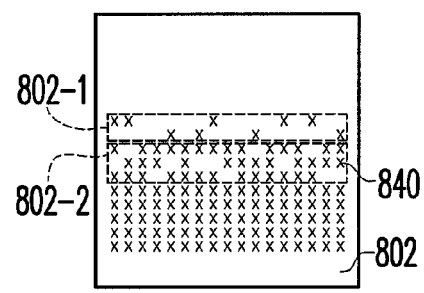
FIG. 8 illustrates an exemplary distribution of undetected or partially detected intentional defects in a test area in the prior art.

FIG. 7 illustrates a method for optimizing the inspection recipe of a defect inspection tool according to an embodiment of this invention.

Referring to FIG. 7, after the area 702 formed with different types of intentional defects 740 of a target layer and locating patterns 720 therein is inspected by the defect inspection tool with an initial inspection recipe to obtain the distribution of the undetected or partially detected intentional defects as represented by the blank spaces in area 702, the intentional defects in the region 702-1 are found difficult to detect, and the intentional defects in the region 702-2 are found marginal to the detection, wherein the intentional defects 740 in the region 702-1 can be called nuisance defects. The number of the undetected or partially detected intentional defects in a row can be counted using the column locating patterns 720 to provide more information for the adjustment of the defect inspection recipe.

In general, a row of intentional defects 740 belongs to a type of intentional defect with a certain parameter value, and two or more consecutive rows may belong to the same type of intentional defect but have different parameter values. For example, in the difficult-to-detect region 702-1, the first row of intentional defects 740 are line end broadening defects each with a first line end width and the second row of intentional defects 740 are line end broadening defects each with a second line end width larger than the first one. Moreover, in other embodiments, the distribution of the detected intentional defects may also be obtained.

Thereafter, the undetected or partially detected intentional defects in the regions 702-1 and 702-2 are located with the locating patterns 720 and then determined for their types based on a table or the like recording the correlation between the locating patterns and the types of intentional defects. In another embodiment where no defect marginal to the detection but only nuisance defects are present, only the nuisance defects are located with the locating patterns and then determined for their types.

The inspection recipe is then modified according to the type(s) of the undetected intentional defects in a manner such that there is a minimal number of undetected or partially detected intentional defects under the inspection of the defect inspection tool, as shown in the right part of FIG. 7. It is noted that when the sensitivity of the inspection tool reaches to its limit, some of the defects cannot be found or fully detected (not shown). The modification generally include adjusting one or more of the parameters, such as intensity, focus and so on, of the detection light source like UV light, deep UV light or electron beam. The rules of the modification can be found in related art and are therefore no described here.

As mentioned above, because the locating patterns allow rapid location of the undetected intentional defects in this invention, the type(s) of the undetected or partially detected intentional defects can be rapidly determined according to the predetermined distributions of the different types of intentional defects. Thus, the modification of the inspection recipe can be started earlier and the optimization time is shortened.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for optimizing an inspection recipe of a defect inspection tool, comprises:
   providing a substrate having thereon a plurality of intentional defects and a plurality of locating patterns beside the intentional defects;
   using the defect inspection tool to detect the intentional defects with an inspection recipe and obtain a distribution of undetected or partially detected intentional defects;

utilizing the locating patterns to locate the undetected or partially detected intentional defects and determining a type or types of the undetected or partially detected intentional defects based on a correlation between the locating patterns and the types of intentional defects recorded in the defect inspection tool;

modifying the inspection recipe according to the type or types of the undetected or partially detected intentional defects in a manner such that there is a minimal number of undetected or partially detected intentional defects under the inspection of the defect inspection tool.

2. The method of claim 1, wherein the intentional defects and the locating patterns are formed in a test area surrounded by a plurality of product areas.

3. The method of claim 1, wherein the substrate include areas of a plurality of different products, and the intentional defects are designed for one of the products and formed in only a part of a test area surrounded by the areas of the products along with the locating patterns.

4. The method of claim 1, wherein the intentional defects and the locating patterns each comprises a substance or are all openings.

5. The method of claim 1, wherein the intentional defects comprise a substance and the locating patterns are openings, or the intentional defects are openings and the locating patterns comprise a substance.

6. The method of claim 1, wherein the locating patterns include at least one string of locating patterns arranged linearly.

7. The method of claim 6, wherein the at least one string of locating patterns have uniform spacing.

8. The method of claim 6, wherein the at least one string of locating patterns have non-uniform spacing.

9. The method of claim 6, wherein the intentional defects are disposed in rows and columns, and the at least one string of locating patterns includes:

at least one column of row-locating patterns, at least one row of column-locating patterns, or at least one column of row-locating patterns and at least one row of column-locating patterns.

10. The method of claim 6, wherein the intentional defects and the locating patterns are disposed in a parallelogram area, and the at least one string of locating patterns are arranged diagonally in the parallelogram area.

11. The method of claim 6, wherein in the at least one string of locating patterns, a group of locating patterns with an interval of at least one locating pattern each have a shape different from a shape of each of the other locating patterns.

* * * * *